(12) United States Patent
Hwang et al.

(10) Patent No.: US 6,214,688 B1
(45) Date of Patent: Apr. 10, 2001

(54) METHODS OF FORMING INTEGRATED CIRCUIT CAPACITORS HAVING U-SHAPED ELECTRODES

(75) Inventors: Ki-Hyun Hwang, Kyunggi-do; Chang-Won Choi; Seok-Woo Nam, both of Seoul; Bon-Young Koo, Kyunggi-do, all of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/289,347

(22) Filed: Apr. 9, 1999

(30) Foreign Application Priority Data

Apr. 9, 1998 (KR) ................................................ 98-12563

(51) Int. Cl.$^7$ .................................................. H01L 21/20
(52) U.S. Cl. ........................................... 438/396; 438/253
(58) Field of Search ................................ 438/253, 255, 438/258, 259, 396, 397, 398

(56) References Cited

U.S. PATENT DOCUMENTS

| | | | |
|---|---|---|---|
| 5,956,587 | * | 9/1999 | Chen et al. ............................ 438/255 |
| 6,077,742 | * | 9/1999 | Chen et al. ............................ 438/255 |

FOREIGN PATENT DOCUMENTS

| | | |
|---|---|---|
| 198 60 052 A1 | 10/1999 | (DE) . |
| 99-297960 | 10/1999 | (JP) . |

\* cited by examiner

Primary Examiner—David Nelms
Assistant Examiner—Quoc Hoang
(74) Attorney, Agent, or Firm—Myers Bigel Sibley & Sajovec

(57) ABSTRACT

Methods of forming integrated circuit capacitors include the steps of forming a first electrically insulating layer having a conductive plug therein, on a semiconductor substrate, and then forming second and third electrically insulating layers of different materials on the first electrically insulating layer. A contact hole is then formed to extend through the second and third electrically insulating layers and expose the conductive plug. Next, a conductive layer is formed in the contact hole and on the third electrically insulating layer. A step is then performed to planarize the conductive layer to define a U-shaped electrode in the contact hole. The third electrically insulating layer is then etched-back to expose upper portions of outer sidewalls of the U-shaped electrode, using the second electrically insulating layer as an etch stop layer. However, the second electrically insulating layer is not removed but is left to act as a supporting layer for the U-shaped electrode. This second electrically insulating layer preferably comprises a composite of a nitride layer and an oxide layer. To increase the effective surface area of the U-shaped electrode, an HSG layer may also be formed on the inner and outer sidewalls of the U-shaped electrode.

14 Claims, 7 Drawing Sheets

METHODS OF FORMING INTEGRATED CIRCUIT CAPACITORS HAVING U-SHAPED ELECTRODES

RELATED APPLICATION

This application is related to Korean Appn. No. 98-12563, filed Apr. 9, 1998, the disclosure of which is hereby incorporated herein by reference.

1. Field of the Invention

The present invention relates to methods of forming integrated circuit devices and, more particularly, to methods of forming integrated circuit capacitors.

2. Background of the Invention

As DRAMs increase in memory cell density, there is a continuous challenge to maintain sufficiently high storage capacitance within memory cells despite decreasing cell area. Additionally there is a continuing goal to further decrease cell area. Many methods have been proposed to keep the capacitance of such storage capacitors at acceptable levels. One approach is to increase the height of the storage node (electrode of the capacitor). Another approach is to use high dielectric materials such as $Ta_2O_5$, or BST.

However, there are some problems with the approach to increasing the height of the storage node. For example, if the required height of the storage node is more than 10,000 Å, it becomes very difficult to pattern conductive layers as storage nodes. There are also some problems with using high dielectric materials, such as $Ta_2O_5$ and BST, as dielectric films. These problems include the complexity of the fabrication process and reduced reliability.

Figure 1A:
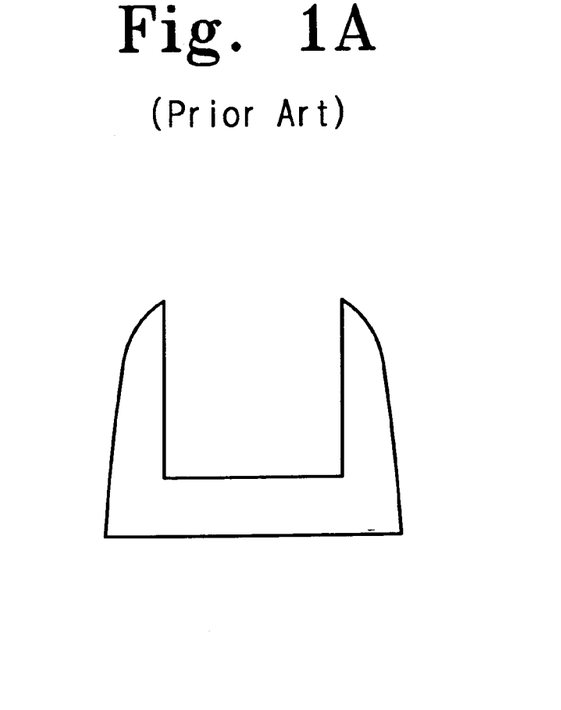
FIG. 1A is a cross-sectional view of an electrode of a capacitor according to the prior art.
Figure 1B:
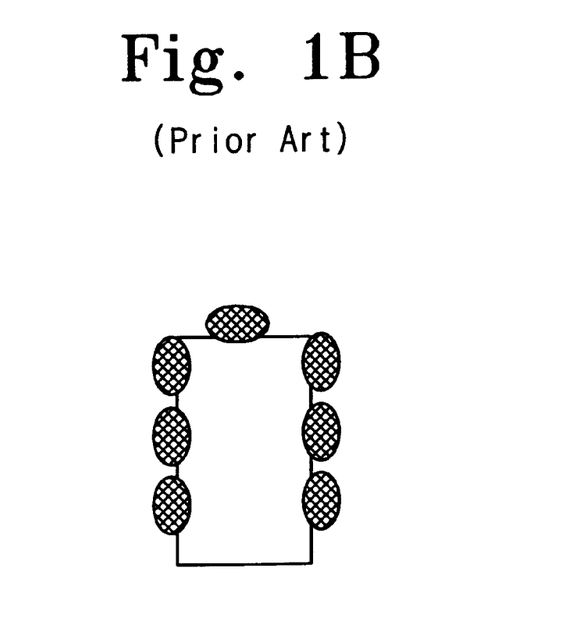
FIG. 1B is a cross-sectional view of an electrode of a capacitor according to the prior art.

Attempts have been made to address these problems. For example, FIG. 1A shows, in cross-section, a "one cylinder stack" (OCS) structure of a capacitor storage node according to the prior art. As can be seen in FIG. 1A, the cup-shaped storage node has a capacitance of about two times larger than that of a simple stack capacitor structure because both outer and inner surfaces of the node can be utilized as an effective capacitor area. FIG. 1B shows, in cross-section, a simple stacked capacitor with an HSG layer on its surface according to the prior art. The simple stacked capacitor with an HSG layer has a capacitance about two times larger than that of a simple stacked capacitor without an HSG layer. One cylinder stack capacitors with HSG layers on both inner and outer surface also can be formed.

Figure 2A:
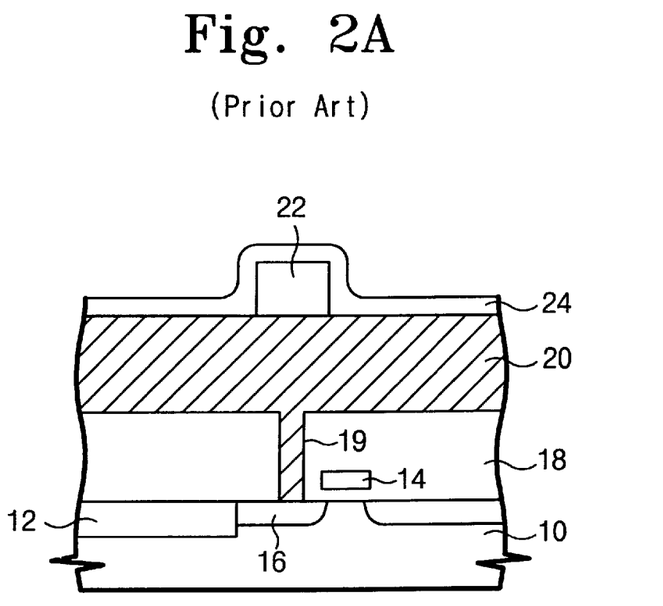
FIGS. 2A–2D are cross-sectional views of intermediate structures that illustrate methods of forming electrodes of capacitors according to the prior art.

FIGS. 2A–2D are cross-sectional diagrams which illustrate a method of fabricating an OCS capacitor with an HSG layer thereon. Referring now to FIG. 2A, a device isolating layer 12 is formed on a predetermined region of a semiconductor substrate 10 to define active and inactive regions. A gate electrode structure 14 is formed over the semiconductor substrate 10. A gate oxide layer also is disposed between the gate electrode structure 14 and the substrate 10. Source/drain regions 16 are formed in the active region adjacent to the gate electrode layer. An interlayer insulating layer 18 is formed over the semiconductor substrate 10 and the gate electrode structure 14. A contact hole 19 is opened in the interlayer insulating layer 18 to expose one of the source/drain regions 16. A polysilicon layer 20 is used as a storage node. This layer is deposited in the contact hole 19 and over the insulating layer 18. A photoresist layer pattern 22 is formed over the polysilicon layer 20 to define a storage node region. A low temperature oxide layer 24 is deposited over the polysilicon layer 20 (including the photoresist pattern 22) to a thickness of about 2,500 Å.

Figure 2B:
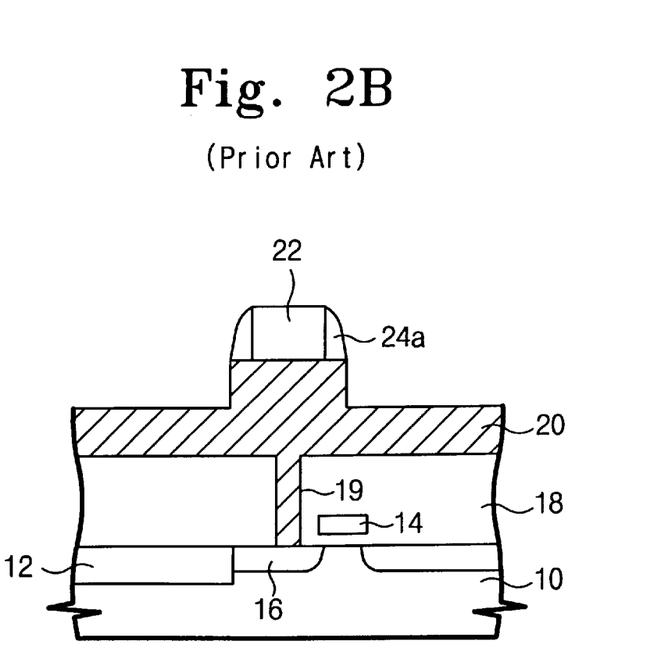

Referring to FIG. 2B, the low temperature oxide layer 24 is then dry etched to form sidewall spacers 24a on the lateral edges of the photoresist pattern 22. Using the photoresist pattern 22 and the sidewall spacers 24a as a mask, a timed etching step is performed on the insulating layer 20 to remove more than half of the original thickness thereof.

Figure 2C:
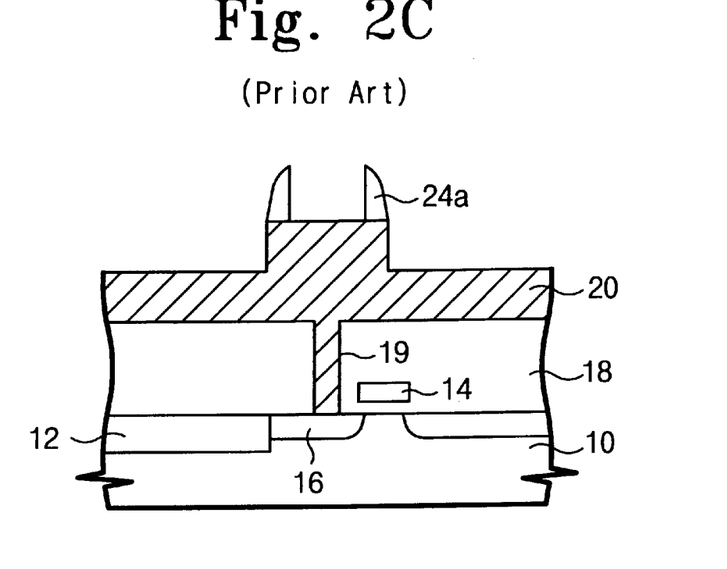
Figure 2D:
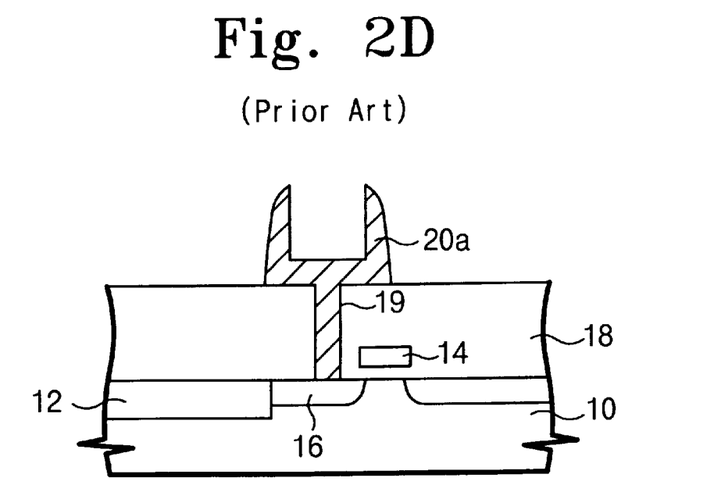

The formation of the storage node structure is next addressed and illustrated in FIGS. 2C–2D. After removing the photoresist pattern 22, the polysilicon layer 20 is etched back, using the sidewall spacers 24a as a mask, to form the storage node structure 20a, as shown in FIG. 2D. Subsequently, an HSG layer (not shown) is formed on the surfaces of the storage node 20a. A dielectric film and top plate are then formed on the storage node 20a using conventional techniques.

The above-described method has some drawbacks. For example, the timed etch conducted on the insulating layer may not provide process reliability, and the polymer resulting from the etch back may contaminate the storage node which affects the dielectric characteristics. The etch back using the sidewall spacers as a mask also may cause a variation in storage node thickness. Moreover, since the thickness of the top portion of the storage node is less than 1,000 Å, the storage node may fall down during a cleaning process and the HSG formation thereon may totally consume the storage node and cause it to break off.

SUMMARY OF THE INVENTION

It is therefore an object of the present invention to provide improved methods of forming integrated circuit capacitors and capacitors formed thereby.

It is another object of the present invention to provide methods of forming integrated circuit capacitors having high capacitance and capacitors formed thereby.

These and other objects, features and advantages of the present invention are provided by methods of forming integrated circuit capacitors that include the steps of forming a first electrically insulating layer having a conductive plug therein, on a semiconductor substrate, and then forming second and third electrically insulating layers of different materials on the first electrically insulating layer. A contact hole is then formed to extend through the second and third electrically insulating layers and expose the conductive plug. Next, a conductive layer is formed in the contact hole and on the third electrically insulating layer. A step is then performed to planarize the conductive layer to define a U-shaped electrode in the contact hole. The third electrically insulating layer is then etched-back to expose upper portions of outer sidewalls of the U-shaped electrode, using the second electrically insulating layer as an etch stop layer. However, the second electrically insulating layer is not removed but is left to act as a supporting layer for the U-shaped electrode. This second electrically insulating layer preferably comprises a composite of a nitride layer and an oxide layer. To increase the effective surface area of the U-shaped electrode, an HSG layer may also be formed on the inner and outer sidewalls of the U-shaped electrode. According to another aspect of the present invention, the planarization step may be preceded by the step of forming a fourth electrically insulating layer on the conductive layer. In this case, the planarization step will include the step of planarizing the fourth electrically insulating layer and the conductive layer to define a U-shaped electrode in the contact hole. To complete the capacitor, steps may also be performed to form a capacitor dielectric layer on the U-shaped electrode and on the second electrically insulating layer and then form an upper capacitor electrode on the capacitor dielectric layer.

DETAILED DESCRIPTION OF THE PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

Figure 3A:
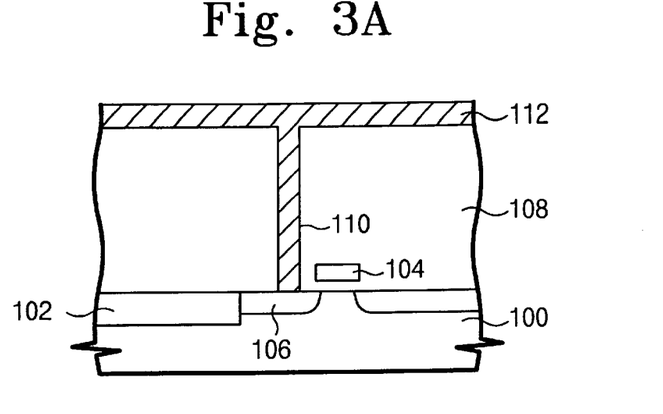
FIGS. 3A–3I are cross-sectional views of intermediate structures that illustrate preferred methods of forming integrated circuit capacitors according to an embodiment of the present invention.

Referring now to FIG. 3A, a cross-sectional view of a semiconductor substrate 100 with a gate electrode structure 104 on its surface is provided. A device isolation layer 102 (e.g., a field oxide layer) is formed on a predetermined area of the semiconductor substrate 100 to define active and inactive regions therein. The gate electrode structure 104 is formed on the active region and a gate oxide layer extends therebetween. Source/drain regions 106 are formed adjacent to the gate electrode structure 104 by implanting impurities into the substrate 100.

A first insulating layer 108 (e.g., an oxide layer) is formed over the semiconductor substrate 100 and over the gate electrode structure 104. The first insulating layer 108 is then etched to form a contact hole 110 therein. This contact hole 110 exposes one of the source/drain regions 106. A first conductive material (e.g., a polysilicon layer 112) is deposited in the contact hole 110 and over the first insulating layer 108 using a chemical vapor deposition (CVD) method. In order to provide a good ohmic contact to the source/drain regions 106, the conductive material may be heavily doped. The doping method may include depositing an in-situ doped polysilicon layer, such as by LPCVD and adding phosphine ($PH_3$) to the CVD reactant gas (e.g., $SiH_4$). Alternatively, the polysilicon layer 112 can be deposited undoped and then impurities can be implanted.

Figure 3B:
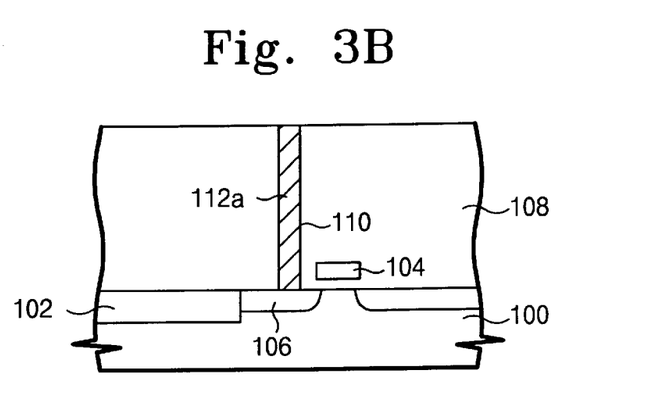

Referring to FIG. 3B, a planarization process is performed on the polysilicon layer 112 to form a contact plug 112a in the contact hole 110. The planarization process may be a CMP or plasma etch-back process. The plasma etch-back may use a CF-based etch gas using $CF_4$, $C_2F_6$, $C_3F_8$, $CH_2F_2$, $CHF_3$, or $SF_6$, or combinations thereof.

Figure 3C:
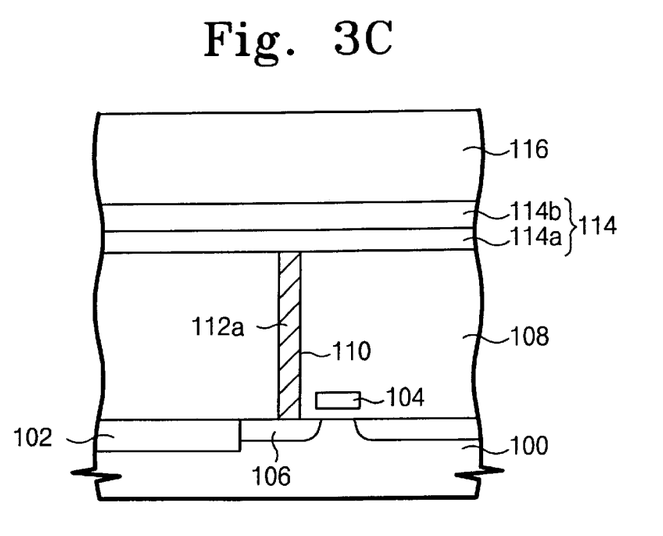

Referring now to FIG. 3C, a second insulating layer 114, comprising a silicon nitride layer 114a and an HTO layer 114b, is deposited over the first insulating layer 108 and contact plug 112a. A third insulating layer 116, comprising a first PECVD oxide layer 116, is then deposited over the HTO layer 114b. The silicon nitride layer 114a is deposited to a thickness of about 70 Å and serves as an etch stop layer during the subsequent step of etching the first PECVD oxide 116. The HTO layer 114b is deposited to a thickness of about 500 Å to 1,500 Å. This HTO layer 114b is provided to serve as an etch stop layer during the step of removing the first PECVD layer 116. As described hereinbelow, the HTO layer 114b can also be used to support a storage electrode of a capacitor. The first PECVD oxide layer 116 may have a thickness of about 5,000 Å.

Figure 3D:
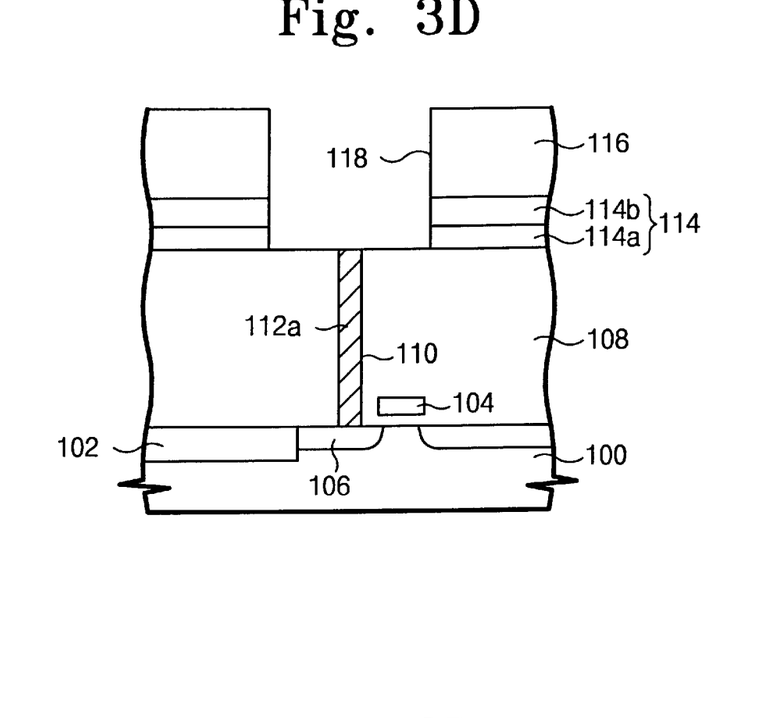

Referring to FIG. 3D, a photoresist layer pattern (not shown) is deposited over the first PECVD oxide layer 116. The first PECVD oxide layer 116, the HTO layer 114b, and the nitride layer 114a are then selectively etched to form an opening 118. The opening 118 exposes the contact plug 112a and surrounding portions of the first insulating layer 108. Here, the nitride layer 114a serves as an etch stop layer during this etching step.

Figure 3E:
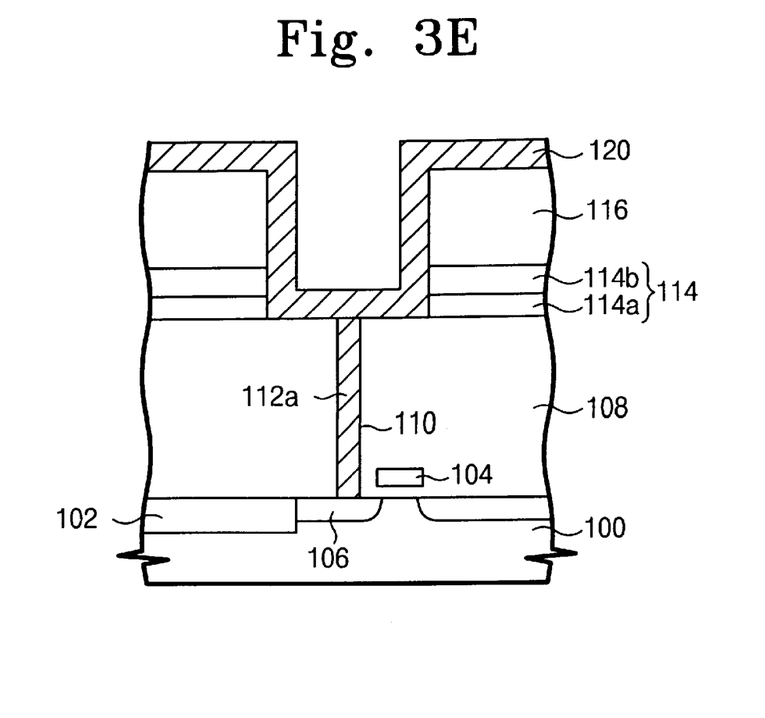

Referring now to FIG. 3E, a second conductive layer 120 (used as storage node) is deposited in the opening 118 and over the first PECVD oxide layer 116. The second conductive layer 120 is preferably made of polysilicon and is deposited to a thickness less than half of the opening width and preferably to a thickness of about 200 Å to 2000 Å.

Figure 3F:
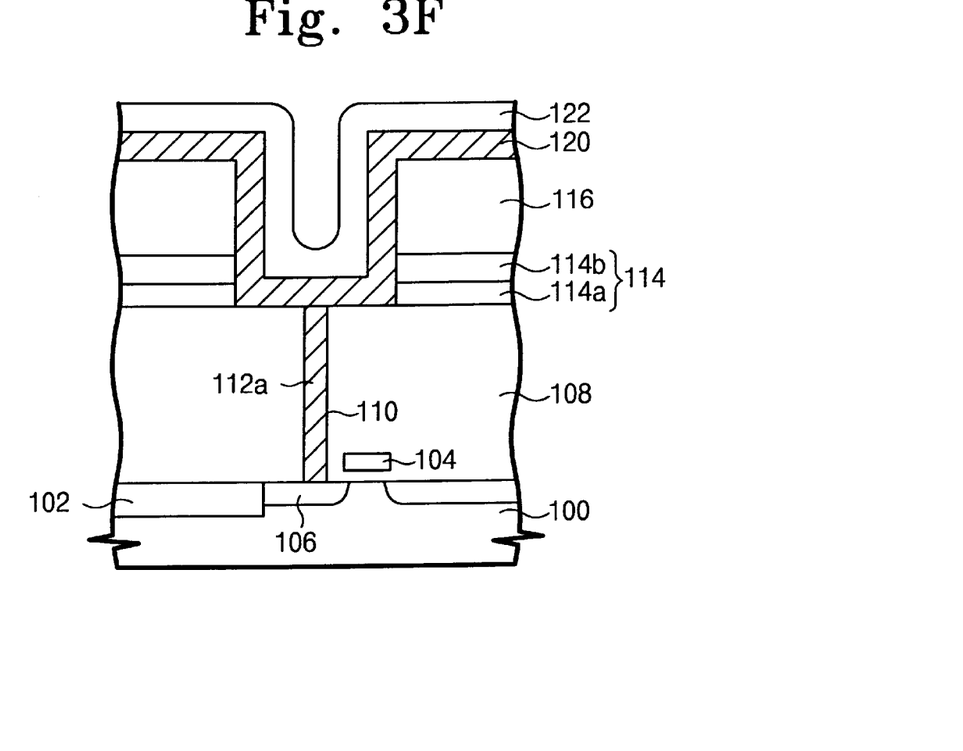

Referring to FIG. 3F, a fourth insulating layer 122 (such as a photoresist layer or an SOG layer) is deposited in the remaining space in the opening 118 and over the polysilicon layer 120 to a thickness of about 100 Å to 10,000 Å. This fourth insulating layer 122 serves a dual purpose of preventing particle impaction (such as polymer) within the opening during the step of removing the polysilicon layer outside of the opening 118 and protecting the polysilicon layer 120 within the opening.

Figure 3G:
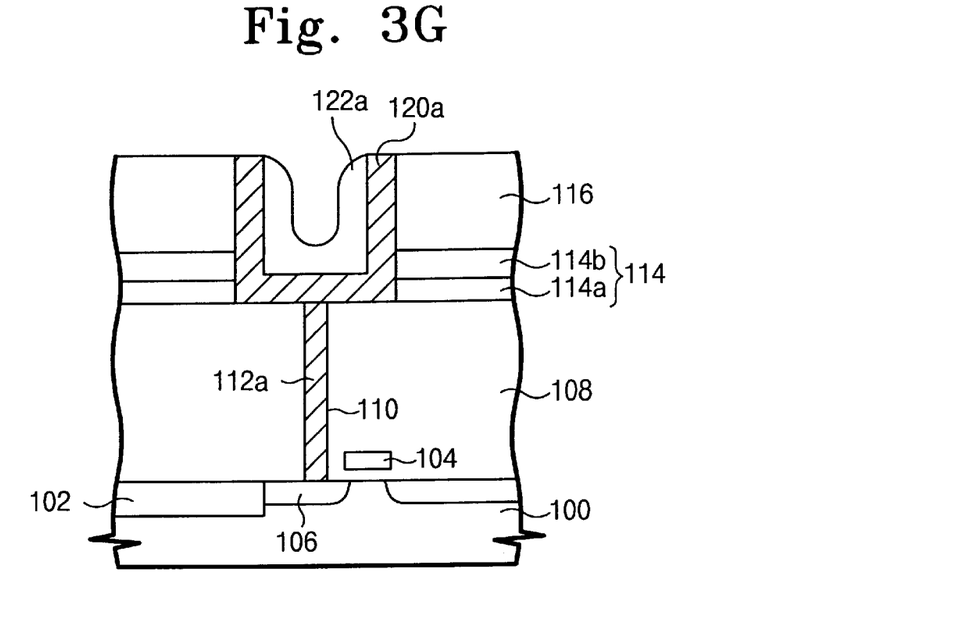

Referring to FIG. 3G, the fourth insulating layer 122 and the polysilicon layer 120 are then etched back (at an etch ratio of about 1:1) until a top surface of the first PECVD oxide layer 116 is exposed. This etch-back step results in the formation of a cup-shaped storage node 120a.

Figure 3H:
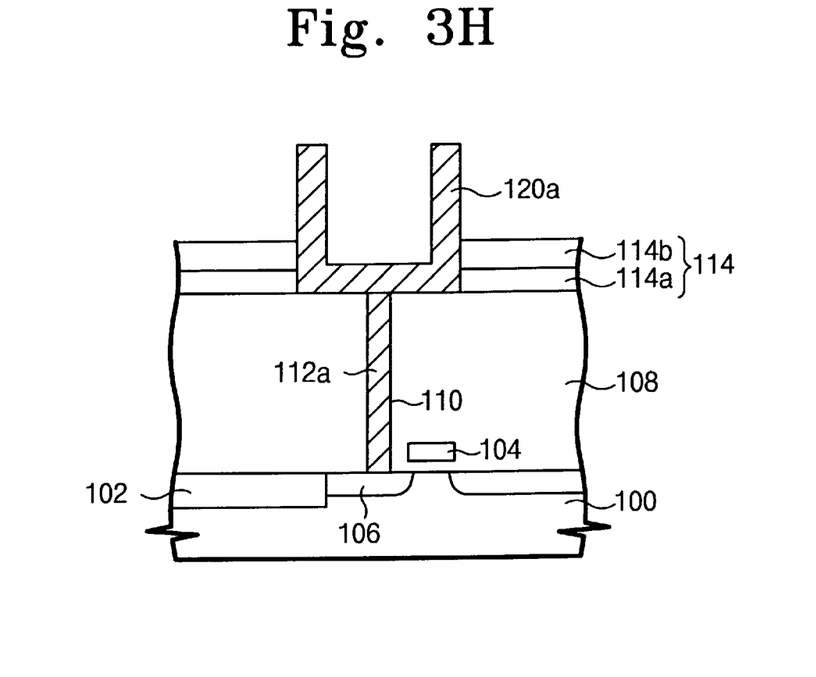

The fourth insulating layer 122a remaining in the opening 118 and the first PECVD oxide layer 116 outside of the opening then are removed, as shown in FIG. 3H. If the fourth insulating layer 122a is a photoresist layer, the first PECVD oxide layer 116 is removed following the removal of the photoresist layer 112a from the opening. In this case, the photoresist layer is removed by ashing and the first PECVD oxide layer 116 is removed by wet etching in a BOE solution. On the other hand, if the fourth insulating layer 122a is an SOG layer, the SOG layer remaining in the cup-shaped storage-node 120a and the first PECVD oxide layer 116 are removed at the same time by wet etching in a BOE solution or dry etching. During these etching steps, the HTO layer 114b serves as an etch stop layer since the first PECVD oxide layer 116 has a high etch selectivity (the etch ratio of the first PECVD oxide layer and HTO layer is about 4:1). The remaining HTO layer 114b and the remaining nitride layer 114a also serve the purpose of supporting the cup-shaped storage node 120a during back-end processing.

Figure 3I:
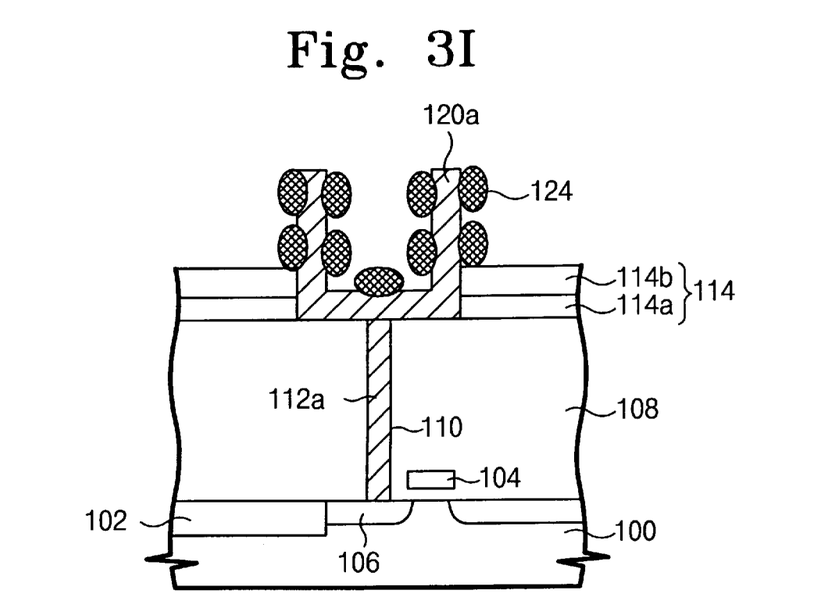

To increase the surface area of the capacitor, a rough conductive layer such as an HSG layer 124 then is formed on the surface of the capacitor by wellknown conventional methods as shown in FIG. 3I. Next, conventional processes for forming a dielectric film and an upper capacitor electrode are carried out to form a complete capacitor structure.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of forming an integrated circuit capacitor, comprising the steps of:

forming a first electrically insulating layer having a conductive plug therein, on a semiconductor substrate;

forming a second electrically insulating layer on the first electrically insulating layer and on the conductive plug, said second electrically insulating layer comprising a composite of a nitride layer and a first oxide layer on the nitride layer;

forming a third electrically insulating layer comprising a material that is different from the first oxide layer, on the second electrically insulating layer;

forming a contact hole that extends through the second and third electrically insulating layers and exposes the conductive plug, an upper surface of the first electrically insulating layer and a sidewall of the second electrically insulating layer;

forming a conductive layer in the contact hole and on the third electrically insulating layer;

planarizing the conductive layer to define a U-shaped electrode in the contact hole and expose the third electrically insulating layer; and etching-back the third electrically insulating layer to expose sidewalls of the U-shaped electrode and expose the first oxide layer, using the first oxide layer as an etch-stop layer and the second electrically insulating layer to support sides of the U-shaped electrode.

2. The method of claim 1, wherein said etching-back step is followed by the step of forming an HSG silicon layer on outer and inner surfaces of the U-shaped electrode.

3. The method of claim 2, wherein said step of forming an HSG silicon layer is followed by the steps of:

forming a capacitor dielectric layer on the HSG silicon layer and on the second electrically insulating layer; and forming an upper capacitor electrode on the capacitor dielectric layer.

4. The method of claim 1, wherein the third electrically insulating layer comprises a second oxide layer that can be selectively wet or dry etched at a rate greater than 2:1 relative to the first oxide layer.

5. The method of claim 4, wherein said planarization step is preceded by the step of forming a fourth electrically insulating layer on the conductive layer; and wherein said planarization step comprises the step of planarizing the fourth electrically insulating layer and the conductive layer to define a U-shaped electrode in the contact hole.

6. The method of claim 5, wherein said etching-back step is preceded by the step of removing the fourth electrically insulating layer using an ashing technique.

7. The method of claim 1, wherein said etching-back step is followed by the steps of:

forming a capacitor dielectric layer on the U-shaped electrode and on the second electrically insulating layer; and forming an upper capacitor electrode on the capacitor dielectric layer.

8. A method of forming a DRAM cell capacitor, comprising the steps of:

forming a memory cell access transistor in a semiconductor substrate;

forming a first electrically insulating layer on the memory cell access transistor;

forming a first contact hole that exposes a source/drain region of the memory cell access transistor, in the first electrically insulating layer;

forming a conductive plug in the first contact hole;

forming a second electrically insulating layer on an upper surface of the first electrically insulating layer and on the conductive plug by:

forming a nitride layer on the first electrically insulating layer and on the conductive plug; and then forming a first oxide layer on the nitride layer so that the nitride layer is disposed between the first oxide layer and the first electrically insulating layer;

forming a third electrically insulating layer comprising a material that is different from the first oxide layer, on the second electrically insulating layer;

forming a second contact hole that extends through the third electrically insulating layer, the first oxide layer and the nitride layer and exposes the conductive plug and the upper surface of the first electrically insulating layer;

forming a conductive layer in the second contact hole and on the third electrically insulating layer; then forming a fourth electrically insulating layer in the second contact hole;

planarizing the fourth electrically insulating layer and the conductive layer in sequence to define a U-shaped electrode in the second contact hole and expose the third electrically insulating layer;

etching-back the third electrically insulating layer to expose outside sidewalls of the U-shape electrode that are supported by the first oxide layer and the nitride layer; and then forming an HSG silicon layer on the exposed outside sidewalls of the U-shaped electrode.

9. The method of claim 8, wherein the third electrically insulating layer comprises a second oxide layer formed from plasma-enhanced chemical vapor deposition (PECVD); and wherein the first oxide layer is a high temperature oxide (HTO) layer.

10. The method of claim 9, wherein the first oxide layer has a thickness in a range between about 500 Å and 1500 Å; and wherein said etching-back step comprises selectively etching-back the third electrically insulating layer at a rate of at least about 4:1 relative to the first oxide layer.

11. The method of claim 8, wherein said etching-back step is preceded by the step of removing the fourth electrically insulating layer using an ashing technique.

12. A method of forming an integrated circuit capacitor, comprising the steps of:

forming a first electrically insulating layer having a conductive plug therein, on a semiconductor substrate;

forming a second electrically insulating layer on the first electrically insulating layer, said second electrically insulating layer comprising a composite of a second material layer and a first material layer that is different from the second material layer and extends between the second material layer and the first electrically insulating layer;

forming a third electrically insulating layer that is different from the second material layer, on the second electrically insulating layer;

forming a contact hole that extends through the second and third electrically insulating layers and exposes the conductive plug, an upper surface of the first electrically insulating layer and a sidewall of the second electrically insulating layer;

forming a U-shaped electrode in the contact hole;

etching back the third electrically insulating layer to expose outside sidewalls of the U-shaped electrode that are supported by the second electrically insulating layer, using the second material layer as an etch-stop layer.

13. The method of claim 12, wherein the first material layer is a nitride layer; wherein the second material layer is a high temperature oxide (HTO) layer; and wherein the third electrically insulating layer is an oxide formed by plasma-enhanced chemical vapor deposition (PECVD).

14. The method of claim 12, wherein the second material layer has a thickness in a range between about 500 Å and 1500 Å; and wherein said etching-back step comprises selectively etching-back the third electrically insulating layer at a rate of at least about 4:1 relative to the second material layer.

\* \* \* \* \*